United States Patent
Chang et al.

(10) Patent No.: US 7,639,533 B2
(45) Date of Patent: Dec. 29, 2009

(54) MULTI-LEVEL MEMORY CELL PROGRAMMING METHODS

(75) Inventors: Chin-Hung Chang, Tainan (TW); Wen-Chiao Ho, Tainan (TW); Kuen-Long Chang, Taipei (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 120 days.

(21) Appl. No.: 12/028,405

(22) Filed: Feb. 8, 2008

(65) Prior Publication Data

US 2009/0201725 A1    Aug. 13, 2009

(51) Int. Cl.
*G11C 11/03* (2006.01)
(52) U.S. Cl. .............. 365/185.03; 365/185.18; 365/185.24; 365/189.09; 365/210.12
(58) Field of Classification Search ............ 365/185.03, 365/185.18, 185.24, 189.09, 210.12
See application file for complete search history.

(56) References Cited

U.S. PATENT DOCUMENTS

| | | | | |
|---|---|---|---|---|
| 5,999,445 A | * | 12/1999 | Rolandi et al. | 365/185.03 |
| 6,714,457 B1 | | 3/2004 | Hsu et al. | |
| 6,847,550 B2 | * | 1/2005 | Park | 365/185.03 |
| 6,870,763 B2 | * | 3/2005 | Banks | 365/185.01 |
| 7,110,300 B2 | | 9/2006 | Visconti et al. | |
| 7,180,780 B1 | | 2/2007 | Ho et al. | |
| 2007/0262388 A1 | | 11/2007 | Ho et al. | |

* cited by examiner

*Primary Examiner*—Pho M. Luu
(74) *Attorney, Agent, or Firm*—Haynes Beffel & Wolfeld LLP

(57) ABSTRACT

A method for programming a plurality of multi-level memory cells described herein includes iteratively changing a bias voltage applied to a first memory cell to program the first memory cell to a first threshold state and detecting when the first cell reaches a predetermined threshold voltage. The bias voltage applied to the first memory cell upon reaching the predetermined threshold voltage is recorded. A second memory cell is programmed to a second threshold state by applying an initial bias voltage to the second memory cell which is function of the recorded bias voltage.

25 Claims, 6 Drawing Sheets

MULTI-LEVEL MEMORY CELL PROGRAMMING METHODS

BACKGROUND OF THE INVENTION

1. Field of the Invention

The present invention relates generally to non-volatile memory devices, and more particularly to methods for programming multi-level cells.

2. Description of Related Art

Non-volatile memory technology includes memory cells that store charge between the channel and gate of a transistor. The charge stored affects the threshold voltage level $V_{th}$ of the transistor, and the threshold voltage level of the transistor due to the stored charge can be sensed to indicate data.

One type of charge storage memory cell is known as a floating gate memory cell. In a floating gate memory cell, source and drain regions are separated by a semiconductor channel region, a tunnel dielectric is formed over the channel, a floating gate of conductive material such as polysilicon is formed over the tunnel dielectric, and an inter-poly dielectric is formed over the floating gate to isolate it from the word line or control gate of the memory cell. The threshold voltage of the memory cell is changed by storing or removing charge on the floating gate by applying appropriate voltages to the control gate and the source and drain regions of the memory cell.

Another type of memory cell based on storing charge between the channel and gate of a field effect transistor uses a dielectric charge trapping structure. In this type of memory cell, a dielectric charge trapping structure is formed over a tunnel dielectric which isolates the dielectric charge trapping structure from the channel, and a top dielectric layer is formed over the charge trapping structure to isolate it from the word line or gate. A representative device is known as a silicon-oxide-nitride-oxide-silicon SONOS cell. The threshold voltage of the memory cell is changed by storing or removing charge on the charge trapping structure by applying appropriate voltages to the gate and the source and drain regions of the memory cell. Because the charge does not move through the non-conductive charge trapping layer, charge can be localized in more than one charge-trapping site within the charge trapping structure. See, for example, U.S. Pat. No. 7,110,300 which is incorporated by reference herein.

FIG. 1 is a graph of a distribution of single-level memory cells having one of two states (storing one bit of data), a low threshold erased state 100 and a high threshold programmed state 102 each having distinct threshold distribution ranges. The low state 100 and high state 102 may have distributions different from an initial distribution 110 of the memory cells prior to performing programming operations.

The low threshold state 100 has a maximum threshold voltage that can be defined as an erase verify voltage $V_{EV}$. The high threshold state 102 has a minimum threshold voltage that can be defined as a program verify voltage $V_{PV}$. In practice the erase verify voltage $V_{EV}$ may be slightly higher than the maximum of the low state 100, and the program verify voltage $V_{PV}$ may be slightly lower than the minimum of the high state 102.

The difference between the program verify voltage $V_{PV}$ and the erase verify voltage $V_{EV}$ defines a read window 101 used to distinguish cells in the low state 100 from cells in the high state 102. The state of a memory cell can be determined by measuring whether the threshold of the memory cell is above or below a predetermined threshold voltage value within the read window 101.

Multi-level memory cells have been developed that can store more than two states, thereby increasing the storage density of the memory cells and providing an efficient technique for reducing die size. FIG. 2 is a graph of a distribution of multi-level memory cells in one of four states (storing two bits of data). The threshold states 200 (zero level), 202 (first level), 204 (second level), and 206 (third level) each have distinct threshold distribution ranges separated by read windows 201, 203, and 205.

The zero level threshold state 200 has a maximum threshold voltage that can be defined as an erase verify voltage $V_{EV}$. The first level threshold state 202 has a minimum threshold voltage that can be defined as a first level program verify voltage $V_{PV1}$, the second level threshold state 204 has a minimum threshold voltage that can be defined as a second level program verify voltage $V_{PV2}$, and the third level threshold state 206 has a minimum threshold voltage that can be defined as a third level program verify voltage $V_{PV3}$.

In order to reliably distinguish between the various states in a multi-level memory cell, accurate control of the amount of charge stored in the memory cell is important. To accurately control the amount of charge stored, program-and-verify methods for programming multi-level memory cells are widely used and involve programming the memory cell in a ramped or step-wise fashion. These methods include an iterative process of performing a programming step followed by a verification step in order to determine whether the desired threshold level of the memory cell has been achieved. Problems with these methods include a slow programming speed since the bias voltages for the initial programming step must be conservatively selected so as to prevent programming the memory cell to an incorrect state. Using such conservatively selected bias voltages for the initial programming step results in a number of programming and verification steps being performed, resulting in a slow programming speed of the memory cell.

Accordingly, it is desirable to have a multi-level memory cell programming method that can determine initial bias voltages such that the programming time of a memory cell is reduced.

SUMMARY OF THE INVENTION

A method is described for programming a plurality of multi-level memory cells programmable to a plurality of different threshold states including a first threshold state and a second threshold state lower than the first threshold state. The method includes iteratively changing a first bias voltage applied to a first memory cell to program the first memory cell to the first threshold state and detecting when the first memory cell reaches a first predetermined threshold voltage. The bias voltage applied to the first memory cell upon reaching the first predetermined threshold voltage is recorded. A second memory cell is programmed to a second threshold state, the programming of the second memory cell comprising applying a first initial bias voltage to the second memory cell which is a function of the recorded bias voltage.

A method for programming a page of data to a plurality of multi-level memory cells capable of storing at least two bits of data is described. The page of data includes a first set of data corresponding to a first threshold state, a second set of data corresponding to a second threshold state lower than the first threshold state, a third set of data corresponding to a third threshold state lower than the second threshold state, and a fourth set of data corresponding to a fourth threshold state lower than the third threshold state. The method includes iteratively applying a changing bias voltage to a first set of memory cells and performing a program verify operation, thereby programming the first set of memory cells to the first threshold state. The bias voltage applied to the first set of memory cells upon one of the first set of memory cells passing a first predetermined threshold voltage that is less than the first threshold state is recorded. The method further includes iteratively applying a changing bias voltage to a second set of memory cells and performing a program verify operation, thereby programming the second set of memory cells to the second threshold state, wherein the bias voltage initially applied to the second set of memory cells is a function of the recorded bias voltage applied to the first set of memory cells. The function of the recorded bias can result in a bias voltage that is equal to the recorded bias voltage, or that is adjusted upwardly or downwardly relative to the recorded bias voltage according to the behavior of the memory cells during programming. The bias voltage applied to the second set of memory cells upon one of the second set of memory cells passing a second predetermined threshold voltage that is less than the second threshold state is recorded. The method further includes iteratively applying a changing bias to a third set of memory cells and performing a program verify operation, thereby programming the third set of memory cells to the third threshold state, wherein the bias voltage initially applied to the third set of memory cells is a function of the recorded bias voltage applied to the second set of memory cells.

An integrated circuit device described herein includes a plurality of multi-level memory cells programmable to a plurality of different threshold states including a first threshold state and a second threshold state lower than the first threshold state. The device also includes a bias arrangement state machine adapted to apply bias arrangements to the memory cells for programming. The bias arrangement for programming includes iteratively changing a bias voltage applied to a first memory cell to program the first memory cell to the first threshold state and detecting when the first memory cell reaches a first predetermined threshold voltage, and applying a first initial bias voltage to a second memory cell which is a function of the bias voltage applied to the first memory cell upon detection of the first memory cell reaching the predetermined threshold voltage.

Advantageously, during programming to a higher threshold state the initial bias for lower threshold states can be dynamically determined so that lower threshold states can be programmed more quickly and efficiently.

DETAILED DESCRIPTION

A detailed description is provided with reference to FIGS. 3A-3D.

FIGS. 3A-3D illustrate a method for programming multi-level memory cells. As described in more detail below, when a first set of memory cells are being programmed to a higher threshold state, the method determines the initial bias for use in programming memory cells to one or more of the lower threshold states. This is done by applying a succession of programming pulses to program the first set of memory cells to the higher threshold state and recording the bias voltage(s) of the most recent programming pulse when any of the first set of memory cells passes the program verify of a lower programmed state. The recorded bias voltage(s) can be stored in memory and used as the initial bias for programming of memory cells to the lower threshold state. Using the recorded bias voltages eliminates the need to select a conservative initial bias voltage, resulting in increased programming speed.

In the illustrated embodiment of FIGS. 3A-3D, four threshold level states are illustrated, resulting in each memory cell storing two-bits of data. However, it will be understood that the scope of the present invention includes programming memory cells to three or more threshold level states, for storing 2, 3, 4 or more bits per cell. Furthermore, since dielectric charge trapping memory cells can include more than one charge-trapping site, the scope of the present invention includes programming each charge-trapping site to three or more threshold level states, for storing 2, 3, 4, or more bits per site.

Figure 1:
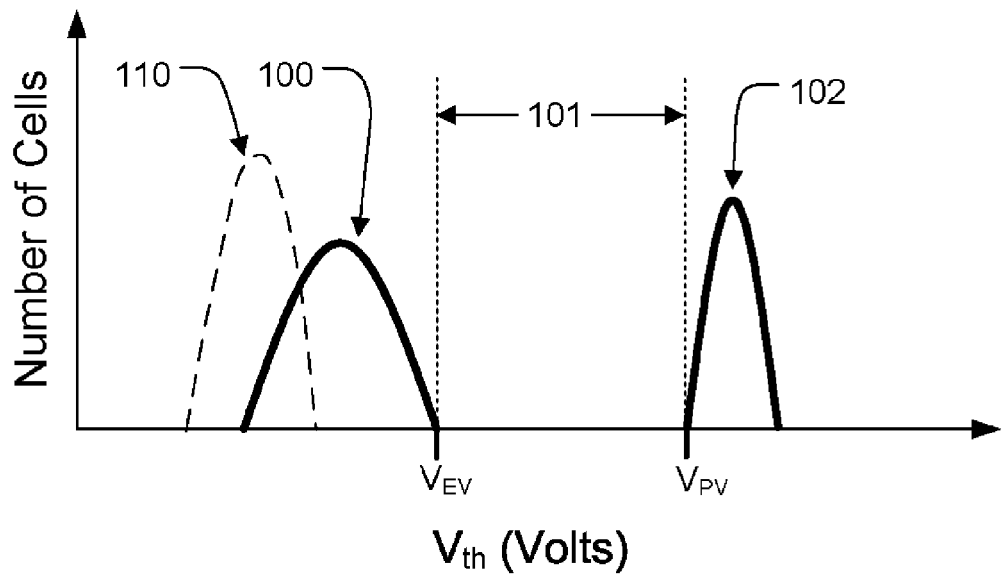
FIG. 1 is a graph of a distribution of single-level memory cells having one of two states, a low threshold erased state and a high threshold programmed state.
Figure 2:
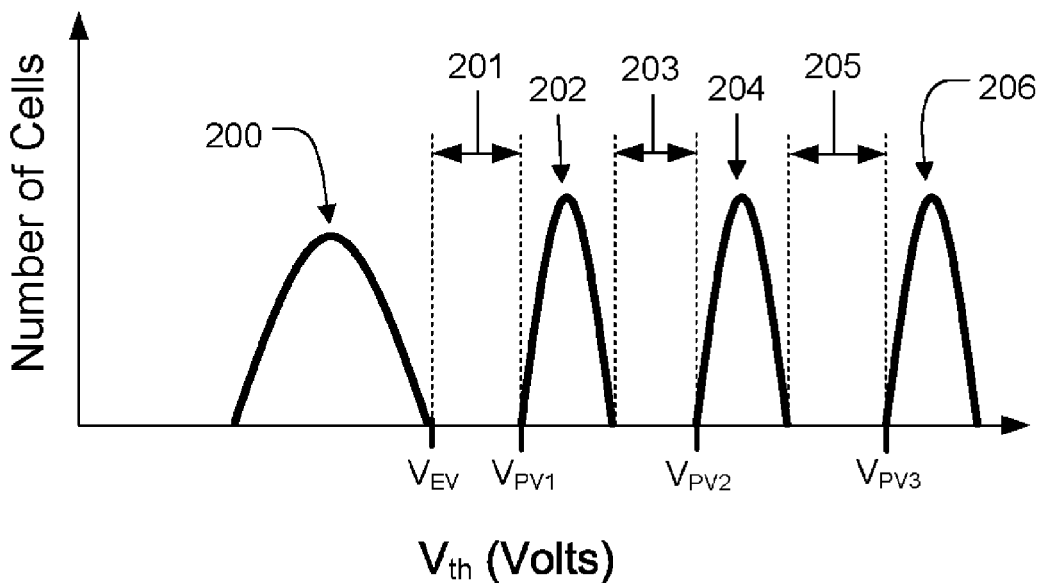
FIG. 2 is a graph of a distribution of multi-level memory cells in one of four states (storing two bits of data).
Figure 3A:
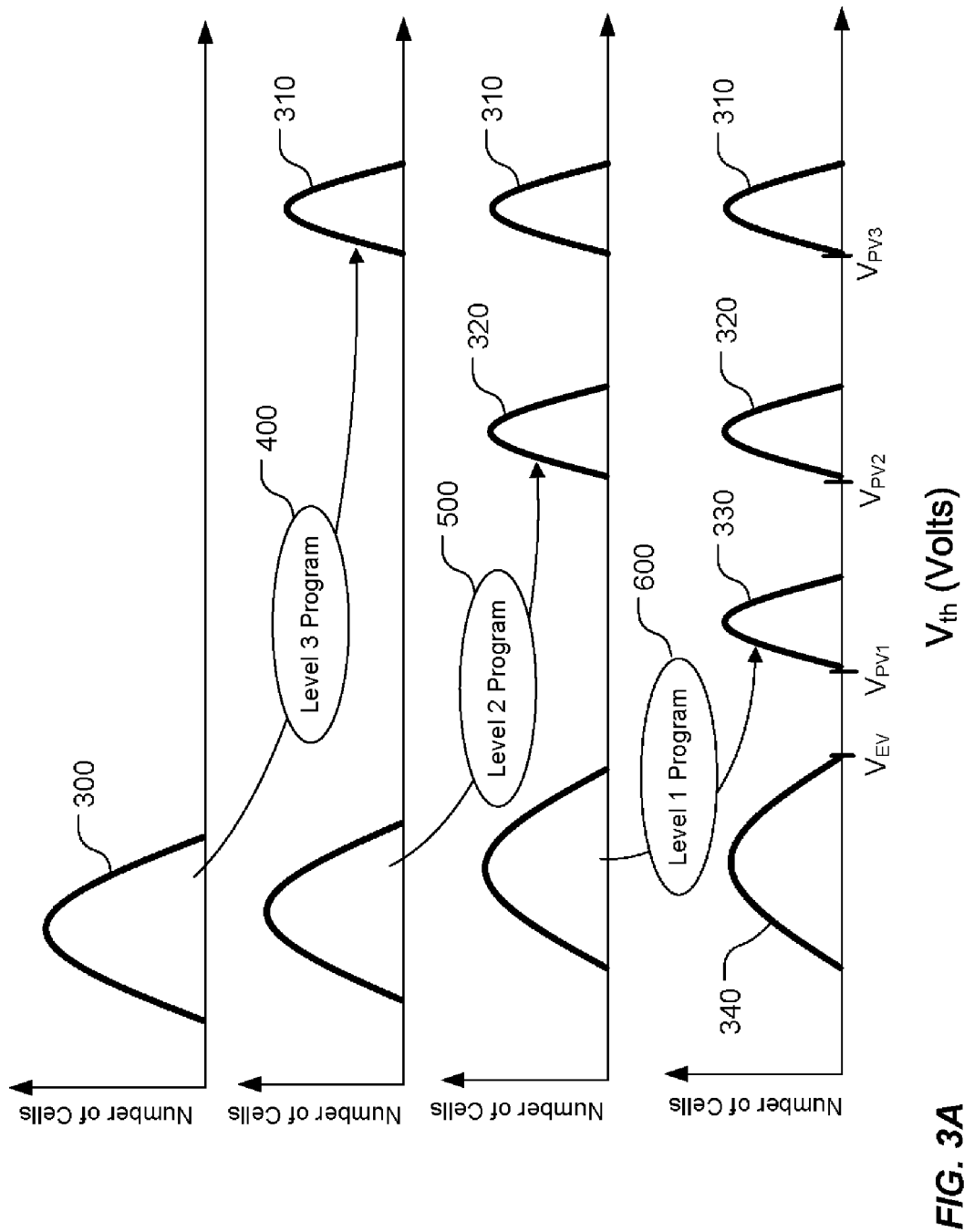
FIGS. 3A-3D illustrate a method for programming multi-level memory cells.

Referring to FIG. 3A, the programming method begins with a plurality of memory cells in a low threshold state 300. Next, programming 400 is performed to program a first set of memory cells to the third level (highest threshold) state 310. Since the third level state 310 is the highest threshold state, memory cells programmed to the third level state 310 will have passed through the program verify voltages of all the states between state 300 and state 3 10. In the illustrated embodiment, this means the memory cells programmed to state 310 will pass through the first level program verify voltage $V_{PV1}$ and the second level program verify voltage $V_{PV2}$.

Once the first set of memory cells have been programmed to the third level state 310, programming 500 is performed to program a second set of memory cells to the second level state 320. As described in detail below, the initial bias for the second level programming 500 is determined during the third level programming 400, resulting in a faster programming speed for the second level programming 500 than if a more conservative initial bias was used.

Next, programming 600 is performed to program a third set of memory cells to a first level state 330. As will be described below, the initial bias for the first level programming 600 is determined during the second level programming 500, resulting in a faster programming speed for the first level programming 600 than if a more conservative initial bias was used.

Figure 3B:
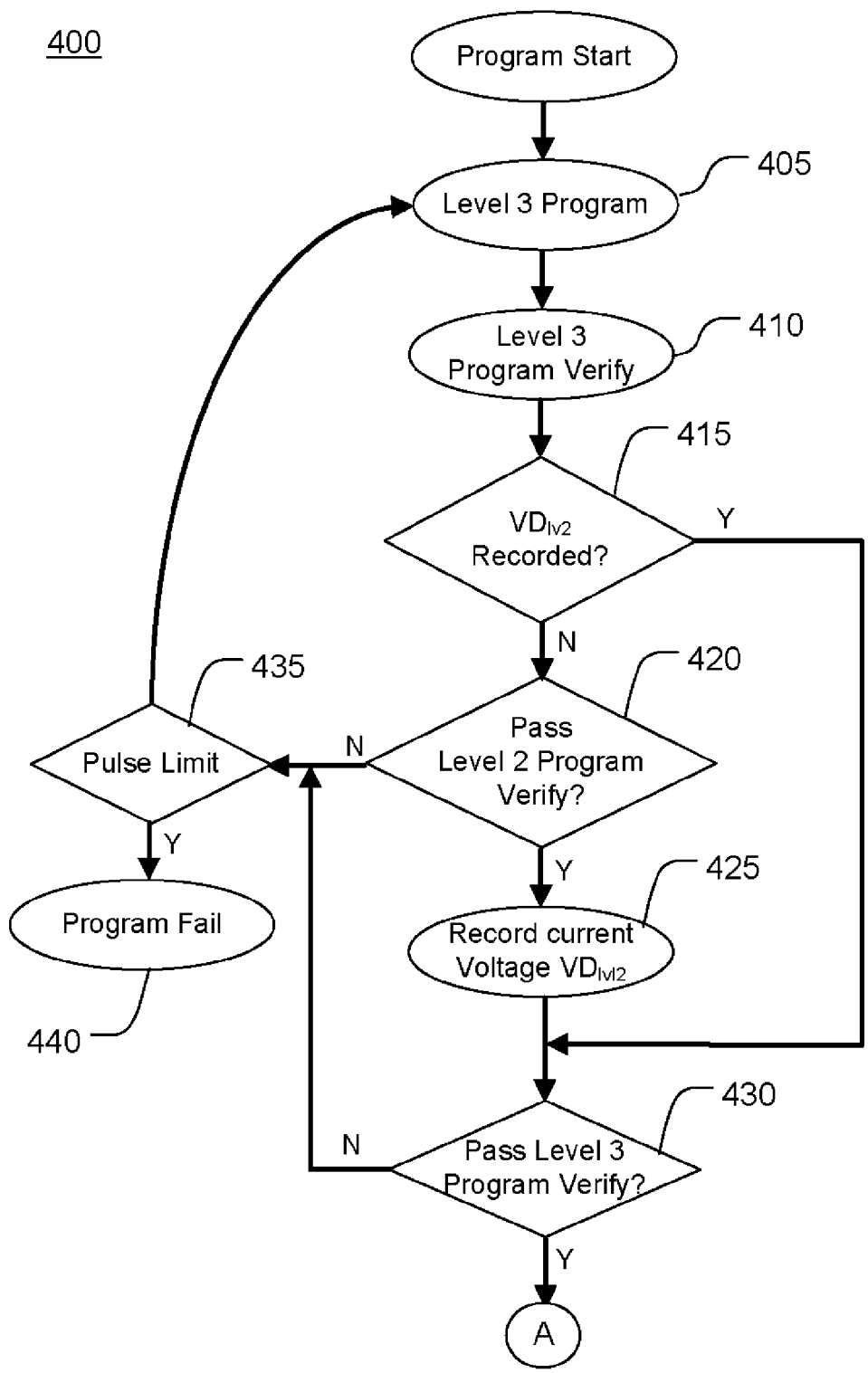

FIG. 3B illustrates a detailed flow diagram of the third level programming 400.

Referring to FIG. 3B, the third level programming 400 begins at step 405 by applying a programming pulse having initial bias voltages on the gates, drains, and sources of each of the first set of memory cells. In one embodiment, initially the gates are biased to 11 V, the drains are biased to 3.5 V, and the sources are biased to 0 V. Also, the programming pulse may be applied, for example, for 500 ns. The bias voltage and pulse length depend on the characteristic of the cell, the type of charge tunneling used (for example, hot carrier injection or Fowler-Nordheim tunneling) and other factors.

Next, at step 410 a third level program verify operation is performed on the first set of memory cells to determine the threshold voltages of the first set of memory cells.

At step 415, it is determined if a voltage $VD_{fv2}$ that will be used as the initial drain bias voltage for the second level programming 500 has already been recorded, this recording indicating that at least one of the first set of memory cells had previously passed a second level program verify operation of step 420.

Since initially the voltage $VD_{Iv2}$ has not been recorded, the programming 400 continues to step 420 where it is determined if any memory cell passes a second level program verify operation.

If none of the first set of memory cells pass the second level program verify operation of step 420, the programming 400 continues to step 435 where it is determined if a limit on the number of third level programming pulses has been reached. If the limit has been reached the programming 400 terminates at step 440. Otherwise, the drain bias voltage is incremented and the programming 400 continues back to step 405, where another programming pulse having the new drain bias voltage is applied.

The third level programming 400 continues in the loop of steps 405, 410, 415, 420, and 435, incrementing the drain voltage for each programming pulse applied at step 405. For example, each time when step 405 is reached the drain bias voltage of the programming pulse may be increased by 25 mV. Other methods for increasing the drain bias, including increasing the drain bias in a stepped linear or in a non-linear fashion, can also be used. This loop continues until at least one of the memory cells passes the second level program verify operation of step 420. Once at least one of the memory cells passes the second level program verify operation of step 420, the drain bias voltage of the most recently applied pulse is recorded as $VD_{Iv2}$. $VD_{Iv2}$ will be used as the initial drain bias of the subsequent second level programming 500, described in more detail below.

Once $VD_{Iv2}$ has been recorded, the programming 400 continues to step 430 where it is determined if all of the first set of memory cells have been programmed to the third level state 310. If not all of the first set of memory cells have been programmed to the third level state 310, the programming 400 continues to step 435, where it is determined whether the program pulse limit has been reached. If the pulse limit has not been reached, at step 405 a programming pulse with an incremented drain voltage is applied to the first set of memory cells that have not passed the third level program verify of step 430. The third level programming 400 continues in the loop of steps 405, 410, 415, 430, and 435, continuing to further increment the drain voltage for each programming pulse applied at step 405 until all of the first set of cells have been programmed to the third level threshold state 310 or the pulse limit is reached.

Figure 3C:
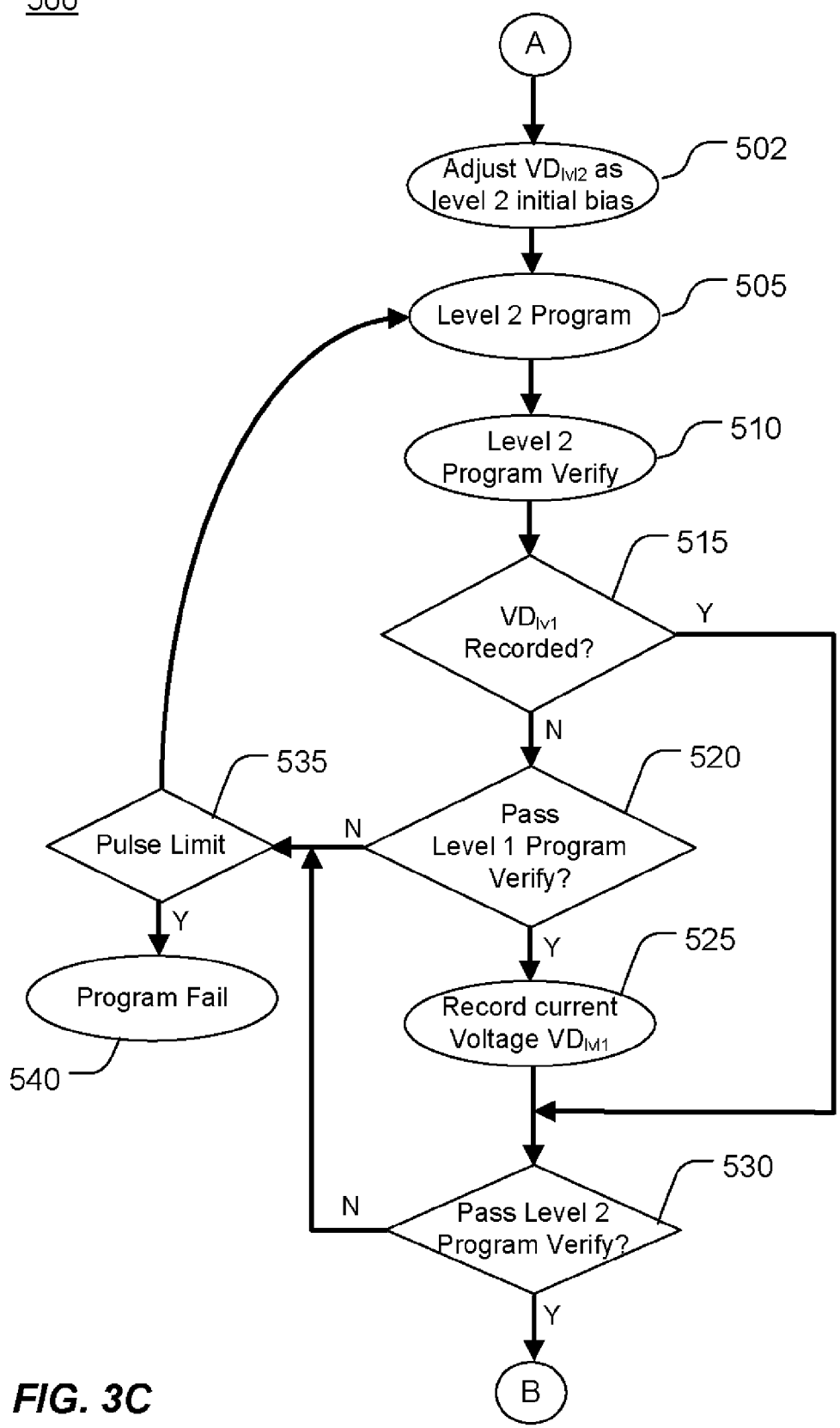

FIG. 3C illustrates a detailed flow diagram of the second level programming 500 of FIG. 3A for a second set of memory cells.

Referring to FIG. 3C, the second level programming 500 begins at step 502 by setting the initial drain voltage of the programming pulse to be applied at step 505 equal to $VD_{Iv2}$. At step 505 the initial programming pulse is applied to the second set of memory cells.

Next, at step 510 a second level program verify operation is performed on the second set of memory cells to determine the threshold voltages of the second set of memory cells.

At step 515, it is determined if a voltage $VD_{Iv1}$ that will be used as the initial drain bias voltage for the first level programming 600 has already been recorded, this recording indicating that at least one of the second set of memory cells had previously passed a first level program verify operation of step 520.

Since initially the voltage $VD_{Iv1}$ has not been recorded, the programming 500 continues to step 520 where it is determined if any of the second set of memory cells pass a first level program verify operation.

If none of the second set of memory cells passes the first level program verify operation of step 520, the programming 500 continues to step 535 where it is determined if the limit on the number of second level programming pulses has been reached. If the limit has been reached the programming 500 terminates at step 540. Otherwise, the drain bias voltage is incremented from the initial value and the programming 500 continues back to step 505, where another programming pulse having the new drain bias voltage is applied.

The second level programming 500 continues in the loop of steps 505, 510, 515, 520, and 535, continuing to further increment the drain voltage for each programming pulse applied at step 505. The incremental increase in the drain voltage may be different from the manner in which the drain voltage was increased in the third level programming 400.

This loop continues until at least one of the second set of memory cells passes the first level program verify operation of step 520. Once at least one of the second set of memory cells passes the first level program verify operation of step 520, the drain bias voltage of the most recently applied pulse is recorded as $VD_{Iv1}$. $VD_{Iv1}$ will be used as the initial drain bias of the subsequent first level programming 600, described in more detail below.

Once $VD_{Iv1}$ has been recorded, the method continues to step 530 where it is determined if all of the second set of memory cells have been programmed to the second state 320. If not all of the second set of memory cells have been programmed to the second level state 320, the method continues to step 535, where it is determined whether the second level programming pulse limit has been reached. If the pulse limit has not been reached, at step 505 a programming pulse with an incremented drain voltage is applied to the second set of memory cells that have not passed the second level program verify of step 530. The second level programming 500 continues in the loop of steps 505, 510, 515, 530, and 535, continuing to further increment the drain voltage for each programming pulse applied at step 505 until all of the second set of memory cells have been programmed to the second level threshold state 320 or the pulse limit is reached.

Figure 3D:
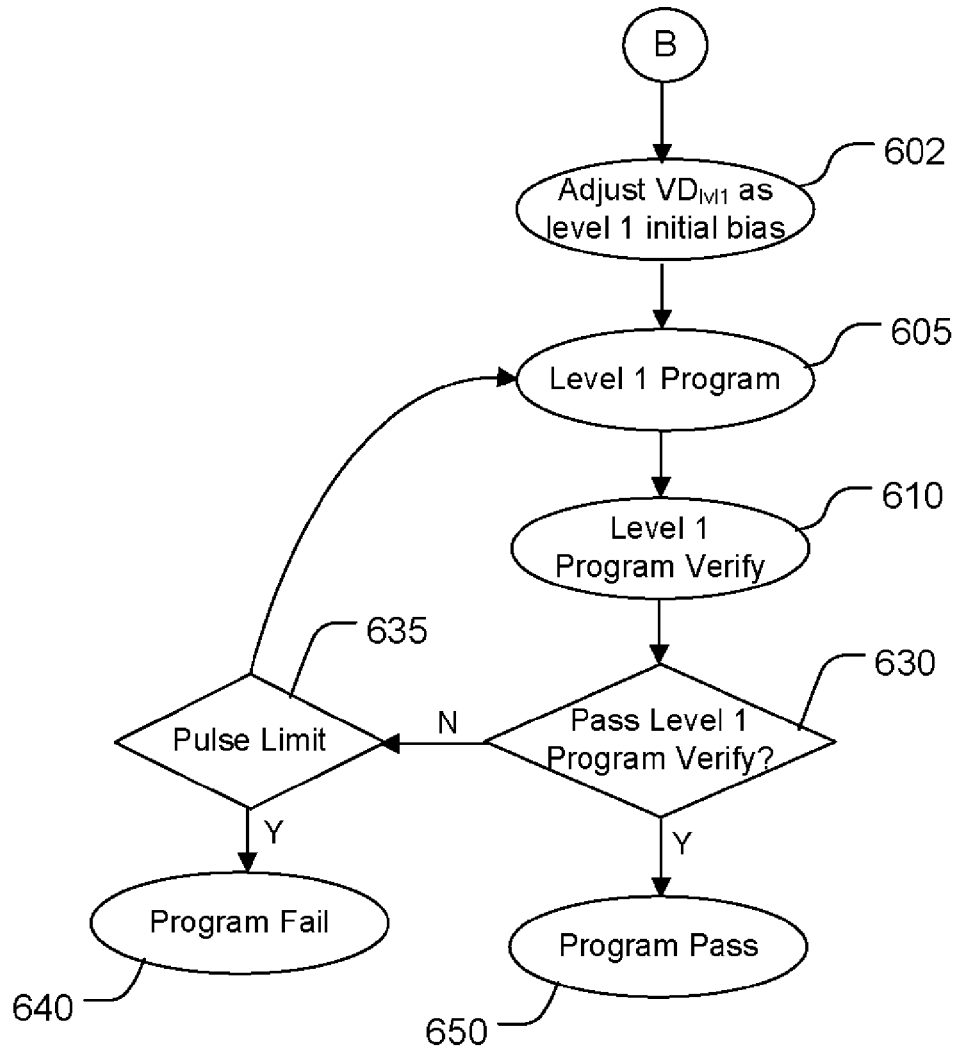

FIG. 3D illustrates a detailed flow diagram of the first level programming 600 for a third set of memory cells.

Referring to FIG. 3D, the first level programming 600 begins at step 602 by setting the drain voltage of the programming pulse to be applied at step 605 equal to $VD_{Iv1}$. At step 605 the initial programming pulse is applied to the third set of memory cells.

Next, at step 610 a first level program verify operation is performed on the third set of memory cells to determine the threshold voltages of the third set of memory cells.

The method then continues to step 630 where it is determined if all of the third set of memory cells have been programmed to the first state 330. If not all of the third set of memory cells have been programmed to the first state 330, the method continues to step 635, where it is determined whether the first level programming pulse limit has been reached. If the pulse limit has not been reached, at step 605 a programming pulse with an incremented drain voltage is applied to the third set of memory cells that have not passed the first level program verify at step 630. The first level programming 600 continues in the loop of steps 605, 610, 630, and 635, continuing to further increment the drain voltage for each programming pulse applied at step 605 until all of the third set of memory cells have been successfully programmed to the first level state 330. The programming process is then terminated at step 650.

In the multi-level memory cell programming method of FIGS. 3A-3D, when a first set of memory cells are being programmed to the third (highest) threshold state 310, the method determines an initial bias for use in programming a second set of memory cells to the second threshold state 320. This is done by programming the first set of memory cells to the third state 310 and determining when any of the first set of memory cells passes the program verify of the second state 320, and then recording the drain bias voltage of the most recently applied programming pulse. The recorded bias voltage is then used as the initial bias for programming a second set of memory cells to the second state 320. Using the recorded bias voltage eliminates the need to select a conservative initial bias for programming the second state 320, resulting in increased programming speed.

Similarly, when the second set memory cells are programmed to the second state 320 the method determines when any of the second set of memory cells pass the program verify of the first state 330, and then recording the drain bias voltage of the most recently applied programming pulse. The recorded bias voltage is then used as the initial bias for programming a third set of memory cells to the first state 310. Using the recorded bias voltage eliminates the need to select a conservative initial bias for programming the first state 310, resulting in increased programming speed.

Thus, during programming to a higher threshold state the initial bias for lower threshold states can be dynamically determined so that lower threshold states can be programmed more efficiently.

The methods described herein can be implemented page by page to dynamically determine the initial bias for lower threshold states for each page of data. The page of data includes a first set of data corresponding to the third state 310, a second set of data corresponding to the second state 320, a third set of data corresponding to the first state 310, and a fourth set of data corresponding to the erased state 340. The method for programming includes iteratively applying a changing bias voltage to a first set of memory cells and performing a program verify operation, thereby programming the first set of memory cells to the third state 310. The bias voltage applied to the first set of memory cells upon any of the first set of memory cells passing a predetermined threshold voltage that is less than the third state 310 is recorded. The method further includes iteratively applying a changing bias voltage to a second set of memory cells and performing a program verify operation, thereby programming the second set of memory cells to the second state 320, wherein the bias voltage initially applied to the second set of memory cells is a function of the recorded bias voltage applied to the first set of memory cells. The bias voltage applied to the second set of memory cells upon any of the first set of memory cells passing a second predetermined threshold voltage that is less than the second state 320 is recorded. The method further includes iteratively applying a changing bias voltage to a third set of memory cells and performing a program verify operation, thereby programming the third set of memory cells to the first state 330, wherein the bias voltage initially applied to the third set of memory cells is a function of the recorded bias voltage applied to the second set of memory cells.

In the illustrated embodiment of FIGS. 3A-3D, the initial drain bias for the second level programming 500 and the first level programming 600 are equal to bias voltages $VD_{Iv2}$ and $VD_{Iv1}$ respectively. Alternatively, the initial drain bias for the second level programming 500 and the first level programming 600 are functions of the bias voltages $VD_{Iv2}$ and $VD_{Iv1}$. For example, the initial drain bias for the second level programming 500 may be adjusted by a predetermined amount from $VD_{Iv2}$. Similarly, the initial drain bias for the first level programming 600 may be adjusted by a predetermined amount from $VD_{Iv1}$. In one embodiment, the initial drain bias for the second level programming 500 is 0.3 V less than $VD_{Iv2}$ and the initial drain bias for the first level programming 600 is 0.5 V less than $VD_{Iv1}$.

In FIGS. 3A-3D, during the third level programming 400 the initial bias voltage for the second level programming 300 is determined, while during the second level programming 500 the initial bias voltage for the first level programming 600 is determined. Alternatively, since the memory cells programmed to the third level state 310 pass both the first and second program verify voltages $V_{PV1}$ and $V_{PV2}$, both of the initial bias voltages of the second level programming 500 and first level programming 600 can be determined during the third level programming 400.

In FIGS. 3A-3D the drain bias is incremented for programming pulses applied during programming of memory cells to a given state while the gate and source voltages are maintained constant. Alternatively, other parameters of the programming pulses may be changed for each successive programming pulse. For example, the gate voltage could be incremented with or instead of the drain voltage, which can be helpful in programming the harder to program memory cells. Changing one or more of the gate, drain, and source voltages may also be done. Also, the pulse length or pulse height may be changed for each successive programming pulse.

In FIGS. 3A-3D, $VD_{Iv2}$ and $VD_{Iv1}$ were respectively recorded when at least one of the first set of memory cells passes the second level program verify operation of step 420 and when at least one of the second set of memory cells passes the first level program verify of step 520. Alternatively, $VD_{Iv2}$ and $VD_{Iv11}$ can be respectively recorded when a predetermined number of the first set of memory cells passes the second level program verify operation of step 420 and when a second predetermined number of the second set of memory cells passes the first level program verify operation of step 520.

Figure 4:
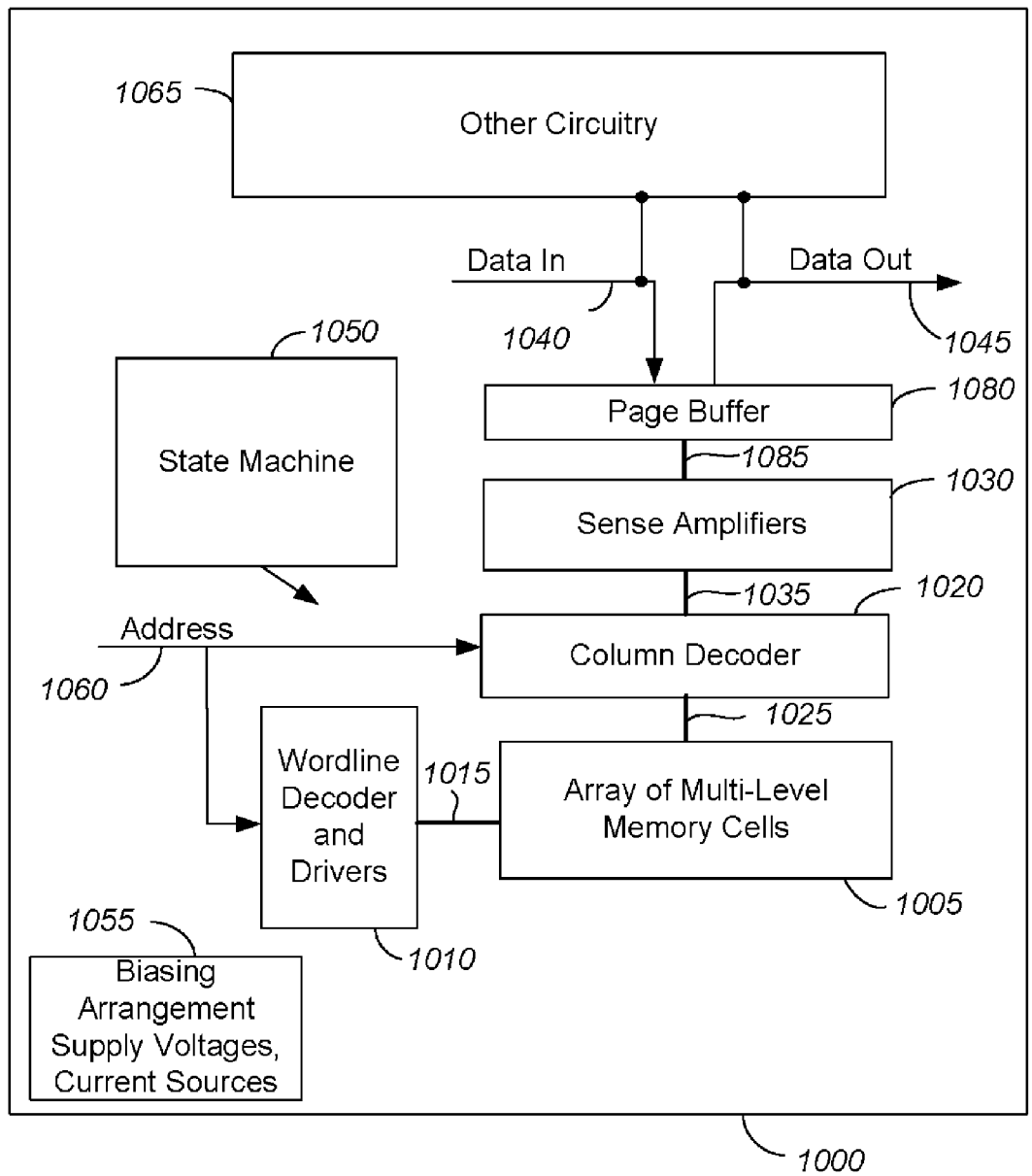
FIG. 4 is a simplified block diagram of an integrated circuit.

FIG. 4 is a simplified block diagram of an integrated circuit 1000 including an array of multi-level memory cells 1005. A row decoder 1010 having read, set and reset modes is coupled to a plurality of word lines 1015 arranged along rows in the memory array 1005. A column decoder 1020 is coupled to a plurality of bit lines 1025 arranged along columns in the memory array 1005 for reading, setting, and resetting memory cells in the memory array 1005. Addresses are supplied on bus 1060 to column decoder 1020 and row decoder 1010. Sense amplifiers in block 1030, including current sources for the read, set, and reset modes, are coupled to the column decoder 1020 via data bus 1035. The sense amplifiers are coupled to a page buffer 1080 via bus 1085, so that data can be moved from the sense amplifiers 1030 to the page buffer 1080 and from the page buffer 1080 to the array 1005 in support of read, erase, and program verify operations. Data is supplied via the data-in line 1040 from input/output ports on the integrated circuit 1000 or from other data sources internal or external to the integrated circuit 1000, to the page buffer 1080. In the illustrated embodiment, other circuitry 1065 is included on the integrated circuit 1000, such as a general purpose processes or special purpose application circuitry, or a combination of modules for providing system-on-a-chip functionality supported by the memory cell array. Data is supplied via the data-out line 1045 from the sense page buffer to input/output ports on the integrated circuit 1000, or to other data destinations internal or external to the integrated circuit 1000.

A controller implemented in this example using bias arrangement state machine 1050 controls the application of bias arrangement supply voltages and current sources 1055, such as read, set, reset and verify voltages and or currents for the word lines and bit lines, and controls the word line/source line operation using an access control process. The state machine 1050 includes program bias registers for storing the recorded bias voltages that are used to program the memory cells. Alternatively, the recorded bias voltages can be stored in other memory within the integrated circuit 1000. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

What is claimed is:

1. A method for programming a plurality of multi-level memory cells programmable to a plurality of different threshold states including a first threshold state and a second threshold state lower than the first threshold state, the method comprising:

iteratively changing a bias voltage applied to a first memory cell to program the first memory cell to the first threshold state and detecting when the first memory cell reaches a first predetermined threshold voltage;

recording the bias voltage applied to the first memory cell upon reaching the first predetermined threshold voltage; and programming a second memory cell to the second threshold state comprising applying a first initial bias voltage to the second memory cell which is a function of the recorded bias voltage.

2. The method of claim 1, wherein the detecting when the first memory cell reaches the first predetermined threshold voltage comprises the first memory cell passing a program verify operation of the second threshold state.

3. The method of claim 1, wherein the first initial bias voltage is equal to the recorded bias voltage.

4. The method of claim 1, wherein the first initial bias voltage is different from the recorded bias voltage by a predetermined voltage value.

5. The method of claim 1, wherein the changing the bias voltage applied to the first memory cell comprises changing a bias voltage applied to a drain terminal of the first memory cell.

6. The method of claim 1, wherein the changing the bias voltage applied to the first memory cell comprises changing a bias voltage applied to a gate terminal of the first memory cell.

7. The method of claim 1, wherein the programming the second memory cell to the second threshold state further comprises changing the first initial bias voltage applied to the second memory cell.

8. The method of claim 1, wherein the plurality of different threshold states includes a third threshold state lower than the second threshold state, programming the second memory cell to the second threshold state further comprises iteratively changing the first initial bias voltage applied to the second memory cell and detecting when the second memory cell reaches a second predetermined threshold voltage, and further comprising:

recording the bias voltage applied to the second memory cell upon reaching the second predetermined threshold voltage; and programming a third memory cell to the third threshold state comprising applying a second initial bias voltage to the third memory cell which is a function of the recorded bias voltage applied to the second memory cell.

9. The method of claim 8, wherein the detecting when the second memory cell reaches the second predetermined threshold voltage comprises the second memory cell passing a program verify operation of the third threshold state.

10. The method of claim 8, wherein the second initial bias voltage applied to the third memory cell is equal to the recorded bias voltage applied to the second memory cell.

11. The method of claim 8, wherein the second initial bias voltage applied to the third memory cell is different from the recorded bias voltage applied to the second memory cell by a predetermined voltage value.

12. The method of claim 8, wherein the changing the bias voltage applied to the second memory cell comprises changing a bias voltage applied to a drain terminal of the second memory cell.

13. The method of claim 8, wherein the changing the bias voltage applied to the second memory cell comprises changing a bias voltage applied to a gate terminal of the second memory cell.

14. The method of claim 8, wherein the programming the third memory cell further comprises changing the second initial bias voltage applied to the third memory cell.

15. A method for programming a page of data to a plurality of multi-level memory cells capable of storing at least two bits of data, the page of data including a first set of data corresponding to a first threshold state, a second set of data corresponding to a second threshold state lower than the first threshold state, a third set of data corresponding to a third threshold state lower than the second threshold state, and a fourth set of data corresponding to a fourth threshold state lower than the third threshold state, the method comprising:

iteratively applying a changing bias voltage to a first set of memory cells and performing a program verify operation, thereby programming the first set of memory cells to the first threshold state;

recording the bias voltage applied to the first set of memory cells upon one of the first set of memory cells passing a first predetermined threshold voltage that is less than the first threshold state;

iteratively applying a changing bias voltage to a second set of memory cells and performing a program verify operation, thereby programming the second set of memory cells to the second threshold state, wherein the bias voltage initially applied to the second set of memory cells is a function of the recorded bias voltage applied to the first set of memory cells;

recording the bias voltage applied to the second set of memory cells upon one of the second set of memory cells passing a second predetermined threshold voltage that is less than the second threshold state;

iteratively applying a changing bias voltage to a third set of memory cells and performing a program verify operation, thereby programming the third set of memory cells to the third threshold state, wherein the bias voltage initially applied to the third set of memory cells is a function of the recorded bias voltage applied to the second set of memory cells.

16. The method of claim 15, wherein:
the first predetermined threshold voltage is a program verify voltage of the second threshold state; and
the second predetermined threshold voltage is a program verify voltage of the third state.

17. An integrated circuit device comprising:
a plurality of multi-level memory cells programmable to a plurality of different threshold states including a first threshold state and a second threshold state lower than the first threshold state; and
a bias arrangement state machine adapted to apply bias arrangements to the memory cells for programming, wherein the bias arrangement for programming comprises iteratively changing a bias voltage applied to a first memory cell to program the first memory cell to the first threshold state and detecting when the first memory cell reaches a first predetermined threshold voltage, and applying a first initial bias voltage to a second memory cell which is a function of the bias voltage applied to the first memory cell upon detection of the first memory cell reaching the first predetermined threshold voltage.

18. The device of claim 17, wherein the first initial bias voltage is equal to the bias voltage applied to the first memory cell upon detection.

19. The device of claim 17, wherein the first initial bias voltage is different from the bias voltage applied to the first memory cell upon detection by a predetermined voltage value.

20. The device of claim 17, wherein the changing the bias voltage applied to the first memory cell comprises changing a bias voltage applied to a drain terminal of the first memory cell.

21. The device of claim 17, wherein the changing the bias voltage applied to the first memory cell comprises changing a bias voltage applied to a gate terminal of the first memory cell.

22. The device of claim 17, wherein the plurality of different threshold states includes a third threshold state lower than the second threshold state, and the bias arrangement further comprises:
iteratively changing the first initial bias voltage to the second memory cell and detecting when the second memory cell reaches a second predetermined threshold voltage to program the second memory cell to the second threshold state; and
applying a second initial bias voltage to a third memory cell which is a function of the bias voltage applied to the second memory cell upon detection of the second memory cell reaching the second predetermined threshold voltage.

23. The device of claim 22, wherein the second initial bias voltage applied to the third memory cell is equal to the bias voltage applied to the second memory cell upon detection.

24. The device of claim 22, wherein the second initial bias voltage applied to the third memory cell is different from the bias voltage applied to the second memory cell upon detection by a predetermined voltage value.

25. The device of claim 22, wherein the bias arrangement further comprises iteratively changing the second initial bias voltage applied to the third memory cell to program the third memory cell to the third threshold state.

* * * * *